United States Patent

Garboushian

[15] 3,649,872

[45] Mar. 14, 1972

[54] PACKAGING STRUCTURE FOR HIGH-FREQUENCY SEMICONDUCTOR DEVICES

[72] Inventor: Vahan Garboushian, Torrance, Calif.

[73] Assignee: TRW Inc., Los Angeles, Calif.

[22] Filed: July 15, 1970

[21] Appl. No.: 55,132

[52] U.S. Cl. ....................317/234 R, 317/234 A, 317/234 G, 317/234 J, 317/234 N, 174/52 S

[51] Int. Cl. ..........................................H01l 3/00, H01l 5/00

[58] Field of Search .......................317/234, 235, 1, 3, 4, 4.1, 317/5.4, 6; 174/52, 52 FP; 29/589, 590

[56] References Cited

UNITED STATES PATENTS

| | | | |
|---|---|---|---|
| 3,387,190 | 6/1968 | Winkler | 317/234 |
| 3,479,570 | 11/1969 | Gilbert | 317/234 |
| 3,489,956 | 1/1970 | Yana et al. | 317/234 |
| 3,515,952 | 6/1970 | Robinson | 317/234 |
| 3,554,821 | 1/1971 | Caulton et al. | 317/234 |
| 3,555,375 | 1/1971 | Hilbers | 317/234 |

*Primary Examiner*—John W. Huckert
*Assistant Examiner*—Andrew J. James
*Attorney*—Spensley, Horn and Lubitz

[57] ABSTRACT

A package for a high-frequency semiconductor device. A semiconductor wafer having active regions therein is mounted upon a portion of a metallized thermally conducting ceramic member. The metallized thermally conducting ceramic member is secured within a cavity disposed in a copper header, the cavity being defined by spaced, upwardly depending projections of the copper header. Contact is made to the semiconductor wafer by metal leads cured to metallized portions of the metallized thermally conducting ceramic member, and by a conducting staple lead secured between the spaced projections of the copper header, an active region of the semiconductor device being connected thereto.

11 Claims, 5 Drawing Figures

INVENTOR.
VAHAN GARBOUSHIAN
BY HIS ATTORNEYS
Spensley, Horn & Lubitz

INVENTOR.
VAHAN GARBOUSHIAN
BY HIS ATTORNEYS
Spensley, Horn & Lubitz

PACKAGING STRUCTURE FOR HIGH-FREQUENCY SEMICONDUCTOR DEVICES

BACKGROUND OF THE INVENTION

1. Field of the Invention

The present invention low parasitic semiconductor package is generally related to the semiconductor device packaging technology and, more specifically, to those devices adapted to operate at high frequencies.

2. Prior Art

As semiconductor technology and associated materials have allowed broader ranges of heat dissipation and reduction in the physical size of devices, the use of semiconductor devices for high frequency applications has been greatly expanded. The term high frequency as used herein shall hereinafter be understood to mean frequencies in the range of approximately 2 to 4 gigaHertz and higher. In addition to the problems created by the physical materials and technology itself, the electrical characteristics of devices disclosed by the prior art result in degraded operation of the devices at high frequencies thereby imposing limitations on their use. The devices disclosed by the prior art exhibit electrical characteristics which are deleterious to proper high frequency operations. As an example of problems existing in those devices disclosed in the prior art, parasitic or spurious oscillations, crosstalk between elements and harmonic distortion can all arise where the devices disclosed by the prior art are used at high frequencies.

The present invention low parasitic semiconductor package substantially resolves many of the problems exhibited by devices disclosed in the prior art. Spurious or parasitic oscillations can arise because some part of the output of the device is inadvertently being fed back to the input of the device. Feedback may occur through the existence of interlead capacitance, excessive lead inductance, stray wiring inductance and capacitance, etc., the exact path of the feedback often being difficult to determine. The semiconductor devices disclosed by the prior art typically employ a base lead which is, by reason of the specific packaging used, excessive in length. Where a device was packaged to be mounted upon another structure, the base region of the semiconductor device was wired to a conducting substrate member over a distance which could promote the creation of parasitic oscillations due to the inherent excessive lead inductance, interlead capacitance, etc. The present invention low parasitic semiconductor package substantially solves the problem of excessive lead length and thereby minimizes lead inductance through the construction thereof.

SUMMARY OF THE INVENTION

It is an object of the present invention to provide an improved, high-frequency semiconductor package.

It is another object of the present invention to provide a semiconductor device package which minimizes lead inductance.

It is yet another object of the present invention to provide an improved, high-frequency semiconductor device package which exhibits lower levels of parasitic oscillation and harmonic distortion.

The present invention low parasitic semiconductor package comprises a combination of stratified elements to adapt the structure of the final package to minimize lead length and therefore reduce parasitic oscillations and unwanted harmonic distortion. A copper header is provided, the header having a cavity therein adapted for mounting a thermally conducting ceramic member. The thermally conducting ceramic member is disposed within the cavity, the side walls of the cavity depending upwardly from the header. The thermally conducting ceramic member has two metallized portions disposed upon the top surface thereof, one of the metallized layers being suitable for receiving a semiconductor chip and a contact lead, the other metallized layer being adapted for receiving a second contact lead. The semiconductor wafer, typically being a transistor, is secured to one of the metallized layers. Where the connecting portion of the semiconductor wafer is the collector of the semiconductor device, the contact lead connected to the same metallized layer will thereafter be the collector lead. A conductive, connecting member substantially in the shape of a staple is connected across the cavity of the copper header, the ends of the conductive, connecting member being secured to the spaced side walls of the cavity in the vicinity of the semiconductor chip. An active region of the semiconductor wafer, typically the base region, is electrically connected to the conductive, connecting member, thereby providing a short connection between the base region of the semiconductor wafer and the copper header. Since the base lead is made much shorter than that which is exhibited by the devices disclosed in the prior art, the lead inductance, capacitance, etc., will be reduced thereby reducing spurious oscillations and the generation of unwanted harmonic distortion.

The novel features which are believed to be characteristic of the invention, both as to its organization and method of operation, together with further objectives and advantages thereof will be better understood from the following description considered in connection with the accompanying drawing in which a presently preferred embodiment of the invention is illustrated by way of example. It is to be expressly understood, however, that the drawing is for the purpose of illustration and description only and is not intended as a definition of the limits of the invention.

DESCRIPTION OF THE PRESENTLY PREFERRED EMBODIMENT

Figures 1, 2, 3:
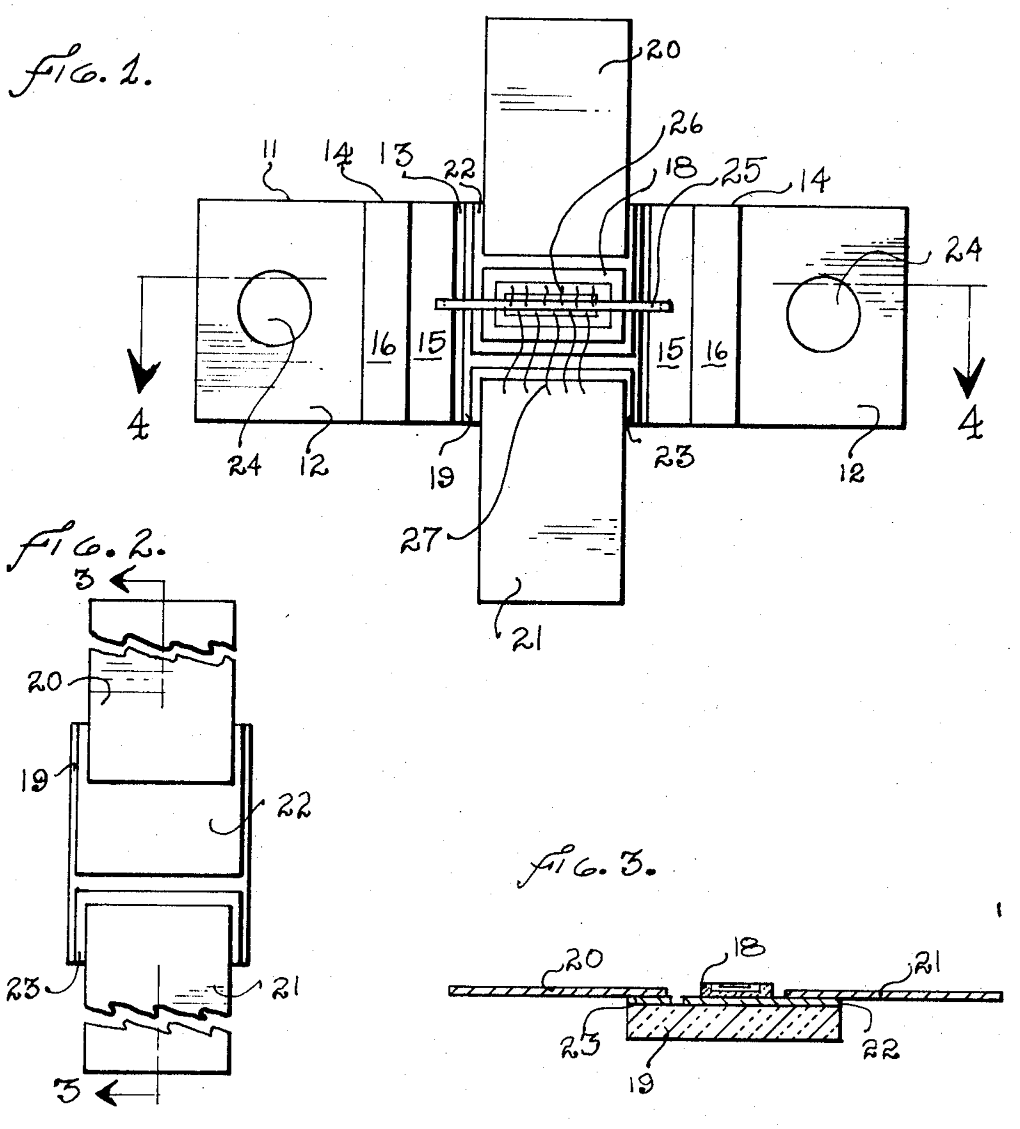
FIG. 1 is a top plan view of a form of the present invention low parasitic semiconductor package.
FIG. 2 is a top plan view of a metallized thermally conducting ceramic member with mounted contact leads in accordance with the present invention.
FIG. 3 is a side elevation, cross-sectional view of a thermally conducting ceramic member taken through line 3—3 of FIG. 2.
Figure 4:
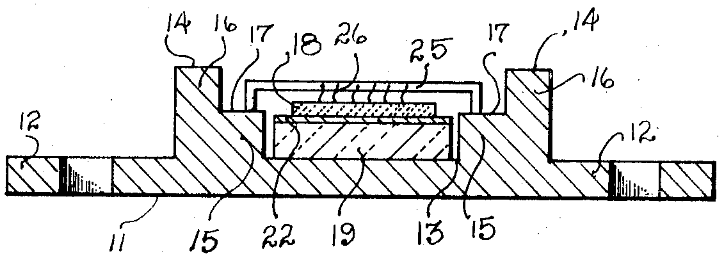
FIG. 4 is a cross-sectional view of a form of the present invention taken through line 4—4 of FIG. 1.

The present invention low parasitic semiconductor package can be best understood by reference to FIG. 1 wherein a form of the present invention is shown therein generally designated by the reference numeral 10. Metal header 11 provides the foundation of the package, metal header 11 comprising three portions, two outer portions 12 and cavity portion 13 therebetween. Cavity portion 13 is separated from outer portions 12 by parallel, vertical walls 14. Vertical walls 14 provide the outer extremities for encapsulation of the mounted semiconductor device. Vertical walls 14 depend upwardly from metal header 11. Vertical walls 14 comprise inner and outer portions 15 and 16 respectively. Inner portions 15 define the outer limits of cavity 13 and depend upwardly in a substantially perpendicular manner with respect to cavity 13. Outer portion 16 of walls 14 depend upwardly beyond inner portion 15 thereby creating a plateau 17 on the top surface of inner portion 15 as can be seen in FIG. 4. Semiconductor wafer 18 is mounted upon metallized thermally conducting ceramic member 19, metallized thermally conducting ceramic member 19 being disposed within and secured to cavity 13 and aligned transverse to the major axis of metal header 11. Coplanar contact leads 20 and 21 are secured to metallized layers 22 and 23 respectively of metallized thermally conducting ceramic member 19 for making contact to two of the active regions of semiconductor wafer 18. Outer portions 12 of metal header 11 have apertures 24 disposed from the top to the bottom surface thereof to provide means for mounting metal header 11 within a larger circuit assembly. Connecting member 25 is secured at each end thereof to plateaus 17 of inner portions 15 of walls 14, connecting member 25 being disposed substantially above semiconductor wafer 18. Connecting member 25 is shaped substantially like a staple, connecting member 25 being a conventional electrically conductive metal such as copper. Contact wires 26 and 27 connect active regions of semiconductor wafer 18 to connecting member 25 and contact lead 21 respectively.

Metal header 11 is preferably constructed of oxygen-free high-conductivity copper. The use of oxygen-free high-conductivity copper is preferred because the fabrication of the present invention low parasitic semiconductor package is typically carried out by utilizing a brazing process in a reducing atmosphere or an atmosphere of conventional forming gas. If oxygen was present in the copper at the time of brazing there could be a reaction thereby causing the copper to swell and produce brazing voids therein. The presence of brazing voids within copper header 11 could result in degraded thermal and electrical properties for the finished products.

Semiconductor wafer 18 can be any conventional semiconductor device adapted for operation at high frequencies, the specific type of semiconductor device being utilized not being part of the present invention. FIG. 1 illustrates a transistor chip 18 being mounted upon metallized thermally conducting ceramic member 19, the emitter region thereof being connected to contact lead 21 via contact wires 27 and the base region of transistor chip 18 being connected to connecting member 25 via contact wires 26. Transistor chip 18 is fabricated in a manner such that the body thereof comprises the collector region of the transistor, therefore, contact lead 20 comprises the collector lead of device 10. Transistor chip 18 is preferably fabricated of silicon, but it could be fabricated of other conventional semiconductor materials such as germanium. The active regions of transistor chip 18 are preferably formed by conventional methods such as diffusion, but the active regions of transistor chip 18 could be disposed therein by other conventional methods such as epitaxial growth.

Referring now to FIG. 2 and FIG. 3, the placement of transistor chip 18 within the present invention low parasitic semiconductor package can be best seen. Transistor chip 18 is mounted upon metallized layer 22 of metallized thermally conducting ceramic member 19. Ceramic member 19 has disposed on the top surface thereof two metallized layers 22 and 23. Metallized layers 22 and 23 are insulated from each other, metallized layer 22 being adapted to receive contact lead 21 and transistor chip 18 and metallized layer 23 being adapted to receive contact lead 20. Referring now to FIG. 2, each metallized layer 22 and 23 is substantially rectangular in shape, three sides of each being substantially parallel to respective edges of metallized thermally conducting ceramic member 19, one edge of each metallized layer 22 and 23 being in parallel, spaced relation with each other. Metallized layers 22 and 23 can be fabricated of conventional contact metals, but they are preferably fabricated of gold.

Metallized thermally conducting ceramic member 19 is preferably fabricated of beryllium oxide (BeO), but ceramic member 19 could also be fabricated of aluminum oxide ($Al_2O_3$). BeO has better conduction properties and therefore is more highly adapted for devices requiring high heat conduction characteristics. Since transistor chip 18 will be directly mounted upon metallized thermally conducting ceramic member 19, high heat conduction characteristics will be desirable and therefore ceramic member 19 is preferably fabricated of BeO. Care must be taken in handling and processing BeO. BeO can be hazardous to the human respiratory system when it is in powder form, therefore, if the BeO member 19 is to be machined or ground, care must be taken to have the proper equipment to insure that improper exposure thereto does not occur.

The structure of the present invention low parasitic semiconductor package can be best seen by reference to FIG. 4 wherein a side elevation, cross-sectional view of the present invention device can be best seen. Metallized thermally conducting ceramic member 19 is placed within cavity 13, ceramic member 19 being bounded by the interior limits of inner portions 15 of walls 14. Referring to FIG. 1, transistor chip 18 is secured to a portion of metallized layer 22, the collector region of transistor chip 18 being in electrical contact with metallized layer 22. Contact lead 20 is secured to a remaining portion of metallized layer 22 thereby making same the collector lead of device 10. Referring again to FIG. 4, connecting member 25 is disposed above transistor chip 18 and secured to transversely aligned portions of plateaus 17 of walls 14. The base region of transistor chip 19 is connected to connecting member 25 by contact wires 26, the emitter region of transistor chip 18 being connected to contact lead 21 by contact wires 27 as shown in FIG. 1. Connecting member 25 is shaped substantially like a staple and can be fabricated of conventional materials, but it is preferably fabricated of copper. Contact wires 26 and 27 can be fabricated of conventional contact materials, but they are preferably fabricated of gold. Contact wires 26 and 27 are bonded to the active regions of transistor chip 18 by conventional methods such as thermocompression bonding or ultrasonic bonding.

Copper header 11 is typically the ground plane of any electrical circuit that device 10 is connected to. By surrounding the circuit with the ground plate constituting copper header 11, the surrounding members being walls 14, operation at high frequencies is facilitated by improving the coupling between the input circuit and ground. Since the presence of parasitic oscillation and unwanted harmonic distortion are a result of excessive lead inductances, capacitances, etc., the structure of the present invention device 10 attacks this problem. By disposing connecting member 25 substantially near transistor chip 18 and securing connecting member 25 directly to the upwardly extended plateau portions 17 of walls 14, there is a substantial reduction in the distance between the base region of transistor chip 18 and the ground plane. Contact wires 26 are permitted to be substantially shortened over those devices disclosed by the prior art thereby reducing lead inductance, capacitance, etc. Reducing lead length will reduce spurious or parasitic oscillations as well as aid in the prevention of unwanted harmonic distortion thereby meeting the objectives of the present invention.

Figure 5:
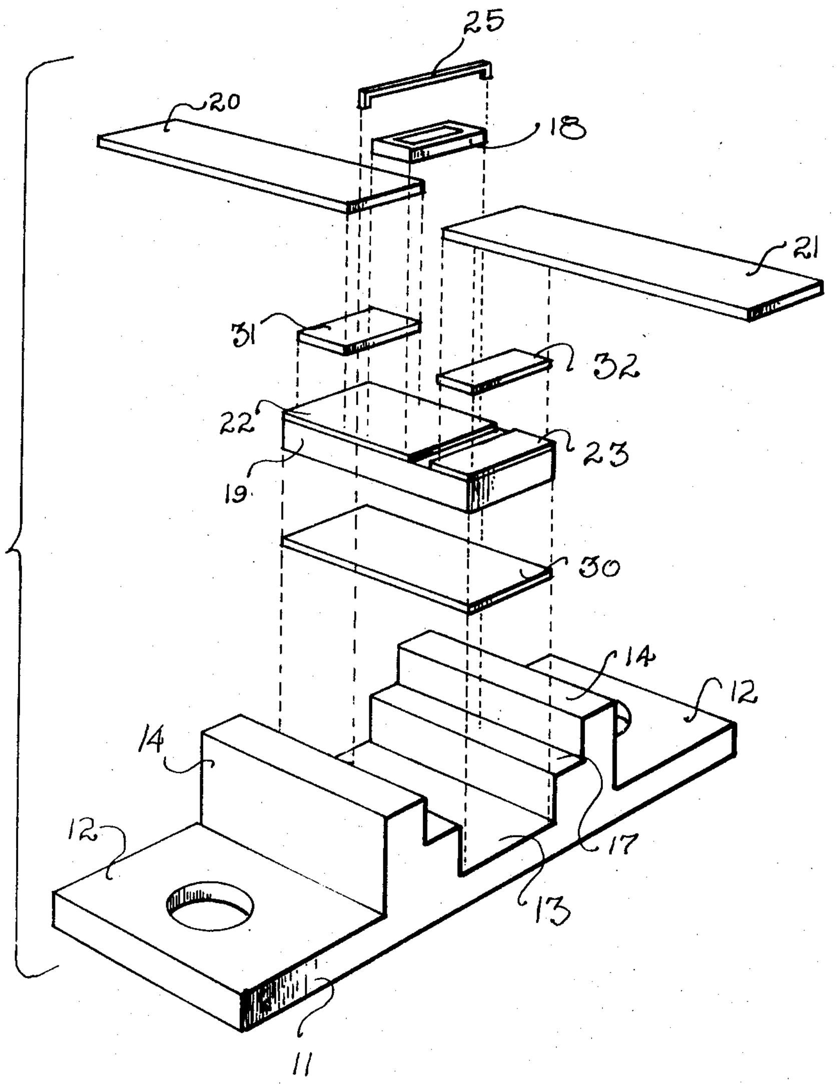
FIG. 5 is an exploded, assembly view of a form of the present invention illustrating the stratified elements thereof.

The manner of fabricating the present invention low parasitic semiconductor package can be best seen by reference to FIG. 5 wherein an exploded, assembly view of the present invention package is shown therein. For the sake of clarity, like elements will be given the same reference numbers as used in the prior figures. Copper header 11 is provided, copper header 11 being oxygen-free, high-conductivity copper. It is preferred that copper header 11 be oxygen free because the package will be subjected to a brazing process carried out in a reducing atmosphere or one of forming gas. If copper header 11 was not substantially oxygen free there could be a reaction wherein the copper would swell creating brazing voids. Brazing voids would necessarily degrade the thermal and electrical properties of the finished product. Copper header 11 is degreased and placed in a reducing atmosphere to purge trapped surface oxygen.

Eutectic preform 30 is placed upon cavity 13 of copper header 11. Eutectic preform 30 can be a conventional eutectic material or brazing preform, but it is preferably a silver-copper eutectic comprising approximately 72 percent silver and 28 percent copper, the specific composition being commercially available under the designation BT foil. The transverse dimension of eutectic preform 30 is slightly less than the distance between inner portions 15 of walls 14, the gaps being present to permit eutectic flow upon heating. Metallized thermally conducting ceramic member 19 is placed upon eutectic preform 30, the bottom surface of ceramic member 19 being in intimate contact and aligned with eutectic preform 30. As set forth hereinabove, ceramic member 19 is preferably fabricated of BeO. Eutectic preform 31 is placed upon and aligned with the portion of metallized layer 22 substantially adjacent a longitudinal edge of copper header 11. Eutectic preform 31 is slightly smaller than the transverse dimension of metallized layer 22, the reduction in size permitting the eutectic to flow upon heating. Eutectic preform 32 is placed upon metallized layer 23 substantially adjacent the edge aligned with the longitudinal edge of copper header 11. As with eutectic preform 31, eutectic preform 32 is slightly smaller than metallized layer 23. Eutectic preform 31 and 32 could be fabricated of conventional eutectic or brazing materials, but the preferred composition is that described hereinabove with respect to eutectic preform 30. Collector contact lead 20 and emitter contact lead 21 are in a planar relationship with each other thereby insuring that the impedance between each lead and ground respectively is substantially the same.

The aligned elements described hereinabove are placed in a nonoxygen atmosphere and heated to a temperature which will exceed the eutectic temperature of the particular material used to implement eutectic preform 30, 31 and 32. After the package is permitted to cool, transistor chip 18 is mounted upon a solder preform and placed upon metallized layer 22. Transistor chip 18 is secured to metallized layer 22 by conventional methods, such as placing the assembly in an inert atmosphere and heating it to a temperature of approximately 400° C. This will insure electrical contact between the collector region of transistor chip 18 and metallized layer 22 of ceramic member 19.

Connecting member 25 can be affixed to copper header 11 in any appropriate manner, connecting member 25 typically being connected to copper header 11 after securing transistor chip 18 to metallized layer 22. Connecting member 25 is connected between plateaus 17 of walls 14, and transversely aligned above the position of transistor chip 18. By securing transistor chip 18 to metallized layer 22, contact lead 20 is in electrical contact with the collector region of transistor chip 18. In order to fully implement the present invention, the base and emitter regions of transistor chip 18 must be connected to the appropriate electrical contact. The emitter region of transistor chip 18 is connected to contact lead 21 by bonding contact wires 27 therebetween as shown in FIG. 1. The base region of transistor chip 18 is connected to contact member 25 by connecting contact wires 26 therebetween as shown in FIG. 1. Contact wires 26 and 27 are bonded between the active regions of transistor chip 18 and the appropriate electrical contacts by conventional methods such as thermocompression bonding or ultrasonic bonding. Contact wires 26 and 27 are preferably fabricated of gold, but they can be fabricated of conventional contact metal such as aluminum.

Referring now to FIG. 4 wherein the cross-sectional view of the final product of the present invention is shown. After device 10 is assembled as described with respect to FIG. 5, protection must be afforded the device to prevent degradation thereof by environmental conditions. A conventional conformal coating is disposed upon the active regions of transistor chip to provide initial protection of transistor chip 18. After the conformal coating is applied, a transfer molding such as plastic or epoxy encapsulation is disposed upon the entire assembly being defined within walls 14. In this manner, the entire assembly including transistor chip 18 and the wiring thereto will be protected against adverse environmental conditions.

The present invention low parasitic semiconductor package produces a device which substantially reduces spurious or parasitic oscillations and prevents the generation of unwanted harmonic distortion. In addition, the present invention package operates at high frequencies, yields a greater operating bandwidth and produces a greater power output than those devices disclosed by the prior art.

I claim:

1. A semiconductor device package for a semiconductor wafer having active regions formed therein comprising:

a. a metal header having a cavity therein defined by spaced upwardly depending sidewalls;

b. a metallized thermally conducting ceramic member having first and second metal layers disposed thereon secured to said metal header within said cavity, said ceramic member being in thermal contact with the cavity portion of said metal header and said first metal layer being secured to the semiconductor wafer and an active region thereof;

c. an electrical connecting member connected between aligned portions of the sidewalls of said metal header; and d. contact means for making electrical contact connected between respective ones of the active regions of the semiconductor wafer and said second metal layer and said electrical connecting member respectively.

2. A semiconductor device package as in claim 1 wherein said semiconductor wafer is a transistor chip.

3. A semiconductor device package as in claim 2 wherein the base region of the transistor chip is connected to said electrical connecting member.

4. A semiconductor device package as in claim 1 wherein said metallized thermally conducting ceramic member is fabricated of BeO.

5. A semiconductor device package as in claim 1 wherein said metal header is fabricated of oxygen-free, high-conductivity copper.

6. A semiconductor device package for a semiconductor chip having at least three active regions disposed therein comprising:

a. a metal header having a cavity disposed therein defined by spaced, upwardly depending walls, each wall having integral inner and outer portions, the outer portion projecting upwardly beyond the inner portion forming plateaus upon the inner portions;

b. a metallized thermally conducting ceramic member having a top and bottom surface and adapted to be received by said cavity, and having first and second metal layers disposed on the top surface thereof, a first portion of said first metal layer being connected to the semiconductor chip and the first active region thereof, the bottom surface of said ceramic member being secured to said metal header within said cavity and being in thermal contact therewith;

c. first and second planar contact leads affixed to a second portion of said first metal layer and to said second metal layer respectively whereby said leads are adapted to be connected to active regions of the semiconductor chip;

d. an electrical connecting contact member, the ends thereof each being secured to a plateau of the inner portion of each of said walls substantially above the semiconductor chip; and e. contact means for making electrical contact connected between the second and third active regions of the semiconductor chip and the electrical connecting contact member and the second contact lead respectively.

7. A semiconductor device package as in claim 6 wherein said metallized thermally conducting ceramic member is fabricated of BeO.

8. A semiconductor device package as in claim 6 wherein said metal header is fabricated of oxygen-free high-conductivity copper.

9. A semiconductor device package as in claim 6 wherein said semiconductor chip is a transistor chip.

10. A semiconductor device package as in claim 9 wherein the base region of the transistor chip is connected to said electrical connecting contact member.

11. A semiconductor device package for use with a semiconductor chip having at least three cooperating active regions therein comprising:

a. a substantially oxygen-free copper header having a top surface with a cavity therein defined by upwardly depending walls in parallel spaced relation with each other, said walls having integral inner and outer portions, the inner portions being adjacent said cavity and having an upper surface substantially parallel to said cavity, the outer portion projecting upwardly beyond the upper surface of said inner portion;

b. a metallized thermally conducting ceramic member having a top and bottom surface and adapted to be received within said cavity and having first and second metal layers disposed on the top surface thereof and having a first portion of said first metal layer being connected to the semiconductor chip and the first active region thereof, the bottom surface of said ceramic member being secured to said metal header within said cavity and being in thermal contact therewith;

c. first and second coplanar contact leads affixed to a second portion of said first metal layer and to said second metal layer respectively whereby each of said leads is adapted to be connected to a different active region of the semiconductor chip;

d. an electrical connecting contact member, each of the ends thereof being connected to the upper surface of an inner portion of each wall and being aligned substantially above the semiconductor chip; and e. contact wires connected between each of two remaining active regions of the semiconductor chip and said electrical connecting contact member and said second contact lead respectively.

* * * * *